(12) United States Patent
Yu

(10) Patent No.: US 8,053,831 B2
(45) Date of Patent: Nov. 8, 2011

(54) SEMICONDUCTOR INTEGRATED CIRCUIT DEVICES HAVING CONTACTS FORMED OF SINGLE-CRYSTAL MATERIALS

(75) Inventor: Man-Jong Yu, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 438 days.

(21) Appl. No.: 12/154,046

(22) Filed: May 20, 2008

(65) Prior Publication Data

US 2009/0020808 A1    Jan. 22, 2009

(30) Foreign Application Priority Data

Jul. 16, 2007  (KR) .................. 10-2007-0071321

(51) Int. Cl.
 *H01L 29/66*  (2006.01)
(52) U.S. Cl. .......... 257/330; 257/68; 257/331; 257/332; 257/333; 257/334; 257/905; 257/906; 257/907; 257/908; 257/E21.646; 257/E27.084; 257/E27.091
(58) Field of Classification Search ............... 257/330, 257/E27.091, 905, 331, 332, 333, 334, E27.084, 257/E21.646, 68, 906, 907, 908
See application file for complete search history.

(56) References Cited

U.S. PATENT DOCUMENTS

| | | | |
|---|---|---|---|
| 6,180,453 B1 * | 1/2001 | Sung et al. ................. | 438/256 |
| 6,521,508 B1 | 2/2003 | Cheong et al. | |
| 2003/0068857 A1 * | 4/2003 | Shukuri et al. ............. | 438/244 |
| 2004/0063313 A1 * | 4/2004 | Shiratake et al. ........... | 438/672 |
| 2005/0095794 A1 * | 5/2005 | Park ........................... | 438/296 |
| 2005/0127437 A1 | 6/2005 | Inagawa et al. | |
| 2006/0006410 A1 * | 1/2006 | Lee et al. ..................... | 257/145 |
| 2006/0138477 A1 * | 6/2006 | Suh ............................. | 257/288 |

* cited by examiner

*Primary Examiner* — Matthew E Warren
*Assistant Examiner* — David Chen
(74) *Attorney, Agent, or Firm* — Onello & Mello, LLP

(57) ABSTRACT

A memory cell of memory device, comprises an active region of a memory cell defined in a semiconductor substrate, and a conductive gate electrode in a trench of the active region. The gate electrode is isolated from the semiconductor substrate. An insulation layer is on the active region and on the conductive gate electrode. A conductive contact is in the insulation layer on the active region at a side of the gate electrode and isolated from the gate electrode. The contact has a first width at a top portion thereof and a second width at a bottom portion thereof, the first width being greater than the second width. The contact is formed of a single-crystal material.

10 Claims, 8 Drawing Sheets

SEMICONDUCTOR INTEGRATED CIRCUIT DEVICES HAVING CONTACTS FORMED OF SINGLE-CRYSTAL MATERIALS

RELATED APPLICATIONS

This application claims priority under 35 U.S.C. 119 to Korean Patent Application No. 10-2007-0071321 filed on Jul. 16, 2007, the content of which is incorporated herein by reference in its entirety.

BACKGROUND OF THE INVENTION

Contemporary semiconductor memory devices commonly employ trench transistors in both memory cell regions and peripheral regions of a device. In a Buried Channel Array Transistor (BCAT) device, for example, a transistor gate is buried in a trench formed in a semiconductor substrate. The buried gate operates to extend the channel length of the resulting transistor structure, resulting in increased integration and greater reliability. Such trench transistors are disclosed, for example, in United States Patent Application Publication No. 2005/0127437, the contents of which are incorporated by reference in their entirety In a conventional trench transistor, a trench is formed in the substrate and the inner walls and base of the trench are coated with an insulative oxide film. A polycrystalline metal fill layer is then provided to fill the trench, and upper regions of the substrate at sides of the trench are doped with impurities to form source and drain regions for the transistor. A relatively thin silicon nitride layer is formed over the resulting structure as an etch stop layer, and an interlayer insulator silicon oxide layer is formed over the etch stop layer. Direct contact holes are then formed in the silicon oxide layer, to expose the source and/or drain regions at sides of the trench gate, using the underlying etch stop layer as an etch stop. Optionally, the source/drain regions can be formed following formation of the contact holes. The side walls and bottoms of the contact holes are then lined with a barrier metal to prevent diffusion during subsequent processes, and the contact holes thus lined are filled with a conductive metal, for example tungsten W, to form the direct contacts.

The resulting direct contacts suffer from a number of limitations that become more problematic as devices are further integrated and operate at higher speeds and at lower voltage levels. For example, the resulting junction between the tungsten contact and the underlying source/drain region formed in the substrate creates a relatively narrow p-n junction, and is therefore highly resistive. In addition, with increased integration, the distance between the gate and source/drain region is reduced, and therefore, leakage current between the gate and source/drain region can be increased. Also, with increased integration, photolithographic alignment is more critical. Under these conditions, the resulting transistor is more likely to fail, or otherwise will operate with reduced reliability. Also, fabrication of such devices can result in reduced yield, and therefore fabrication costs can be increased.

SUMMARY OF THE INVENTION

Embodiments of the present invention are directed to trench transistor structures in which the direct contacts used to contact the underlying source/drain regions are provided, in some embodiments, by forming a single-crystal conductive contacts using selective epitaxial growth (SEG). An upper portion of each of the single-crystal conductive contacts is wider than the lower portion that contacts an underlying source/drain region. A conductive metal plug is then formed on the resulting single/crystal conductive contact to provide a conductive via.

In this manner, the critical dimension of the resulting direct contacts is increased, and thus, the thickness of the inter-layer dielectric through which the contacts are formed can be increased. This, in turn, increases the separation between the bit line and word line of the resulting memory device, which has a direct effect on the bit line loading capacitance of the resulting device. In addition, the SEG layer of the direct contact can be used to effectively extend the channel length of the resulting transistor, since the source/drain regions can be formed in the SEG layer, leading to increased device integration.

Further, a low-resistance junction is provided at the boundary of the narrow bottom portion of the SEG layer and the underlying substrate. Although a p-n junction is formed at the junction of the top portion of the SEG layer and the above-lying conductive metal plug, the interface is relatively wider, and therefore, resistance of the upper junction can be controlled to acceptable values. Also, leakage current between the direct contact and the trench gate is manageable, since the lower portion of the direct contact has a reduced width, and is therefore made to be a relatively further distance from the top of the gate.

In one aspect, a memory cell of memory device comprises: an active region of a memory cell defined in a semiconductor substrate; a conductive gate electrode in a trench of the active region, the gate electrode being isolated from the semiconductor substrate; an insulation layer on the active region and on the conductive gate electrode; and a conductive contact in the insulation layer on the active region at a side of the gate electrode and isolated from the gate electrode, the contact having a first width at a top portion thereof and having a second width at a bottom portion thereof, the first width being greater than the second width, the contact being formed of a single-crystal material.

The single crystal material of the contact can be formed using a selective epitaxial growth process.

The trench can comprise first and second trenches in the active region that are spaced apart from each other, and the conductive gate electrode can comprise first and second conductive gate electrodes respectively in the first and second trenches, and the bottom portion of the conductive contact can be on the semiconductor substrate at a position between the first and second gate electrodes and is isolated from the first and second gate electrodes.

The opening can comprise a first opening and the conductive contact can comprise a first conductive contact and the memory cell can further comprise second and third conductive contacts at sides of the first and second gate electrodes respectively opposite the first conductive contact, the second and third conductive contacts being formed of the single-crystal material, the second and third contacts each having a first width at a top portion thereof and having a second width at a bottom portion thereof, the first width being greater than the second width, and the second and third contacts each being isolated from the first and second gate electrodes respectively.

The semiconductor substrate can include a memory cell region and a peripheral region and the memory cell can further comprise: an array of memory cells in the memory cell region, each memory cell comprising the first and second gate electrodes in a corresponding active region of the memory cell region and the first, second and third contacts, the array of memory cells extending in the memory cell region in a first direction and in a second direction of the semiconductor substrate; a plurality of peripheral transistors in the peripheral region; wherein neighboring first gate electrodes and neighboring second gate electrodes are connected in the first direction to form a first word line and a second word line respectively, the first and second word lines each extending in the first direction between the memory cell region and the peripheral region; and a bit line on the insulation layer extending in the second direction, the bit line connected to the first contacts of neighboring memory cells in the second direction, the bit line connected to a gate of a peripheral transistor in the peripheral region.

The peripheral transistor can comprise one of a trench transistor having a gate that is formed a trench in the peripheral region of the semiconductor substrate and a conventional transistor having a gate that is formed on a surface of the peripheral region of the semiconductor substrate.

The first contact can be doped with an impurity to provide a source region of the memory cell in the first contact; and the second and third contacts can be doped with an impurity to provide drain regions of the memory cell in the second and third contacts.

The first contact can be doped with an impurity to provide a drain region of the memory cell in the first contact; and the second and third contacts can be doped with an impurity to provide source regions of the memory cell in the second and third contacts.

The contact can be doped with an impurity to provide a source or drain region in the contact.

The insulation layer can comprise: a first insulation layer on the semiconductor substrate and on the gate electrode; a second insulation layer on the first insulation layer, the second insulation layer comprising a material that has etch selectivity with respect to a material of the first insulation layer; and a third insulation layer in the second insulation layer and on the first insulation layer, the third insulation layer comprising a material that has etch selectivity with respect to the material of the second insulation layer, the third insulation layer lining at least a lower portion of an opening formed in the second insulation layer through which the contact is disposed, the first insulation layer and the third insulation layer surrounding, and in direct contact with, a lower portion of the contact, the contact provided through the first, second, and third insulation layers.

Upper sidewalls of the contact can be in direct contact with the third insulation layer, or upper sidewalls of the contact can be in direct contact with the second insulation layer.

The first insulation layer and third insulation layer can each comprise a silicon nitride material and the second insulation layer can comprise a silicon oxide material.

The insulation layer can comprise: a first insulation layer on the semiconductor substrate and on the gate electrode; and a second insulation layer in the first insulation layer, the second insulation layer comprising a material that has etch selectivity with respect to a material of the first insulation layer, the third insulation layer lining at least a lower portion of an opening formed in the first insulation layer through which the contact is disposed, the third insulation layer surrounding, and in direct contact with, a lower portion of the contact, the contact provided through the first and second insulation layers.

Upper sidewalls of the contact can be in direct contact with the second insulation layer, or upper sidewalls of the contact can be in direct contact with the first insulation layer.

The first insulation layer can comprise a silicon oxide material and the second insulation layer can comprise a silicon nitride material.

The memory cell can further comprise: an array of gate electrodes in first and second directions on the semiconductor substrate; neighboring gate electrodes in the first direction being connected to provide a word line of a memory device; and neighboring conductive contacts in the second direction being connected to provide a bit line of the memory device.

The memory cell can further comprise an insulative capping layer in the trench on the conductive gate electrode.

The memory cell can further comprise an insulative gate electrode layer in the trench between the conductive gate electrode and the active region of the semiconductor substrate.

The memory cell can further comprise a conductive layer in contact with sidewalls and a top of the conductive contact.

A height of the exposed upper portions of the sidewalls can be less than a height of the conductive contact.

The memory cell can further comprise a conductive layer on the patterned insulation layer and on a top portion of the conductive contact.

The conductive contact can be of a height relative to a surface of the semiconductor substrate that is less than a height of the insulation layer relative to the semiconductor substrate, and the conductive layer can extend partially through the insulation layer to contact the conductive contact.

The conductive contact can be of a height relative to a surface of the semiconductor substrate that is same as a height of the insulation layer relative to the semiconductor substrate, and wherein the conductive layer contacts the conductive contact.

In another aspect, a memory device comprises: a memory cell region of a semiconductor substrate comprising an array of memory cells, the array of memory cells extending in a first direction and in a second direction of the semiconductor substrate; a peripheral region of the semiconductor substrate comprising a plurality of peripheral transistors; wherein each memory cell of the memory cell region comprises: first and second conductive gate electrodes in corresponding first and second trenches of an active region of the memory cell region, the first and second gate electrodes being isolated from the active region; an insulation layer on the active region and on the conductive gate electrode; and a first conductive contact in the insulation layer on the active region at sides of the first and second gate electrodes and isolated from the first and second gate electrodes, wherein the bottom portion of the first conductive contact is on the semiconductor substrate at a position between the first and second gate electrodes and is isolated from the first and second gate electrodes; and second and third conductive contacts on the semiconductor substrate at sides of the first and second gate electrodes respectively opposite the first conductive contact, and the second and third conductive contacts each being isolated from the first and second gate electrodes respectively, wherein the first, second and third contacts each have a first width at a top portion thereof and have a second width at a bottom portion thereof, the first width being greater than the second width, and wherein the first, and third contacts comprise a single-crystal material; wherein neighboring first gate electrodes and neighboring second gate electrodes are connected in the first direction to form a plurality of first word lines and a plurality of second word line respectively of the memory device, each of the first word lines and the plurality of second word lines extending in the first direction between the memory cell region and the peripheral region; and a plurality of bit lines on the insulation layer extending in the second direction, the bit lines each connected to the first contacts of neighboring memory cells in the second direction, each bit line connected to a gate of a corresponding peripheral transistor in the peripheral region.

The single crystal material of the first, second and third contacts can be formed using a selective epitaxial growth process.

The first contacts can be doped with an impurity to provide source regions of the memory cells in the first contacts; and the second and third contacts can be doped with an impurity to provide drain regions of the memory cells in the second and third contacts.

The first contacts can be doped with an impurity to provide drain regions of the memory cells in the first contact; and the second and third contacts can be doped with an impurity to provide source regions of the memory cells in the second and third contacts.

The plurality of peripheral transistors can comprise one of a trench transistor having a gate that is formed a trench in the peripheral region of the semiconductor substrate and a conventional transistor having a gate that is formed on a surface of the peripheral region of the semiconductor substrate.

Each peripheral transistor can further include source and drain regions, and further comprising: fourth and fifth conductive contacts on the semiconductor substrate at sides of the gate electrode of the peripheral transistor, the fourth and fifth conductive contacts each being isolated from the gate electrodes respectively, wherein the fourth and fifth conductive contacts each have a first width at a top portion thereof and have a second width at a bottom portion thereof, the first width being greater than the second width, and wherein the first, and third contacts comprise a single-crystal material.

The single crystal material of the fourth and fifth contacts can be formed using a selective epitaxial growth process.

The insulation layer can comprise: a first insulation layer on the semiconductor substrate and on the first and second gate electrodes; a second insulation layer on the first insulation layer, the second insulation layer comprising a material that has etch selectivity with respect to a material of the first insulation layer; and a third insulation layer in the second insulation layer and on the first insulation layer, the third insulation layer comprising a material that has etch selectivity with respect to the material of the second insulation layer, the third insulation layer lining at least a lower portion of openings formed in the second insulation layer through which the first, second and third contacts are disposed, the first insulation layer and the third insulation layer surrounding, and in direct contact with, a lower portion of the first, second, and third contacts, the first, second and third contacts provided through the first, second, and third insulation layers.

Upper sidewalls of the first, second and third contacts can be in direct contact with the third insulation layer.

Upper sidewalls of the first, second and third contacts can be in direct contact with the second insulation layer.

The first insulation layer and third insulation layer can each comprise a silicon nitride material and the second insulation layer can comprise a silicon oxide material.

The insulation layer can comprise: a first insulation layer on the semiconductor substrate and on the first and second gate electrodes; and a second insulation layer in the first insulation layer, the second insulation layer comprising a material that has etch selectivity with respect to a material of the first insulation layer, the third insulation layer lining at least a lower portion of openings formed in the first insulation layer through which the first, second and third contacts are disposed, the third insulation layer surrounding, and in direct contact with, a lower portion of the first, second and third contacts, the first, second and third contacts provided through the first and second insulation layers.

Upper sidewalls of the first, second and third contacts can be in direct contact with the second insulation layer, or upper sidewalls of the first, second and third contacts can be in direct contact with the first insulation layer.

The first insulation layer can comprise a silicon oxide material and the second insulation layer can comprise a silicon nitride material.

The memory device can further comprise insulative capping layers in the first and second trenches on the corresponding first and second conductive gate electrodes of each memory cell.

The memory device can further comprise an insulative gate electrode layer in the first and second trenches between each of the first and second conductive gate electrodes and the active region of each memory cell.

The memory device can further comprise a conductive layer in contact with upper sidewalls and a top of the first, second and third conductive contacts of the plurality of memory cells.

A height of the upper sidewalls can be less than a height of the first, second and third conductive contacts.

The memory device can further comprise a conductive layer on the patterned insulation layer and on top portions of the first, second and third conductive contacts of the plurality of memory cells.

The first, second and third conductive contacts can be each of a height relative to a surface of the semiconductor substrate that is less than a height of the insulation layer relative to the semiconductor substrate, and the conductive layer can extend partially through the insulation layer to contact the first, second and third conductive contacts of the memory cells.

The first, second, and third conductive contacts can be each of a height relative to a surface of the semiconductor substrate that is same as a height of the insulation layer relative to the semiconductor substrate, and the conductive layer can contact first, second and third conductive contacts of the memory cells.

In another aspect, a method of fabricating a semiconductor device comprises: forming a trench in an active region of a semiconductor substrate; providing a conductive gate electrode in the trench, the gate electrode being isolated from the semiconductor substrate; providing a patterned insulation layer on the semiconductor substrate and on the gate electrode, the patterned insulation layer including an opening that exposes the semiconductor substrate at a side of the gate electrode, the opening having a first width at a top portion thereof and having a second width at a bottom portion thereof at an interface with the semiconductor substrate, the first width being greater than the second width; and forming a conductive contact in the opening using selective epitaxial growth, the contact having a first width at a top portion thereof and having a second width at a bottom portion thereof, the first width being greater than the second width, and the contact being isolated from the gate electrode.

Forming the trench can comprise forming first and second trenches in the active region that are spaced apart from each other, and providing a conductive gate electrode can comprise providing first and second conductive gate electrodes respectively in the first and second trenches, wherein the bottom portion of the opening in the patterned insulation layer is between the first and second gate electrodes so that the bottom portion of the conductive contact is on the semiconductor substrate at a position between the first and second gate electrodes and is isolated from the first and second gate electrodes.

The opening can comprise a first opening and the conductive contact can comprise a first conductive contact, wherein the patterned insulation layer further includes second and third openings that expose the semiconductor substrate at sides of the first and second gate electrodes respectively opposite the first conductive contact, and further comprising: forming second and third conductive contacts in the second and third openings respectively using selective epitaxial growth, the second and third contacts each having a first width at a top portion thereof and having a second width at a bottom portion thereof, the first width being greater than the second width, and the second and third contacts each being isolated from the first and second gate electrodes respectively.

The semiconductor substrate can include a memory cell region and a peripheral region and further comprising: forming an array of memory cells in the memory cell region, each memory cell comprising the first and second gate electrodes formed in a corresponding active region of the memory cell region and the first, second and third contacts, the array of memory cells extending in the memory cell region in a first direction and in a second direction of the semiconductor substrate; forming a plurality of peripheral transistors in the peripheral region; first and second gate electrodes of neighboring memory cells in the first direction being connected in the first direction to form respective first and second word lines, the first and second word lines extending in the first direction between the memory cell region and the peripheral region; and forming a bit line on the patterned insulation layer, the bit line connected to the first contacts of neighboring memory cells in the second direction, the bit line connected to a gate of a peripheral transistor in the peripheral region.

The method can further comprise forming the peripheral transistor in the peripheral region, wherein the peripheral transistor comprises one of a trench transistor having a gate that is formed in a trench in the peripheral region of the semiconductor substrate and a conventional transistor having a gate that is formed on a surface of the peripheral region of the semiconductor substrate.

The method can further comprise: doping the first contact with an impurity to form a source region in the first contact; and doping the second and third contacts with an impurity to form drain regions in the second and third contacts.

The method can further comprise: doping the first contact with an impurity to form a drain region in the first contact; and doping the second and third contacts with an impurity to form source regions in the second and third contacts. The method can further comprise doping the contact with an impurity to form a source or drain region in the contact.

Providing a patterned insulation layer can comprise: providing a first insulation layer on the semiconductor substrate and on the gate electrode; providing a second insulation layer on the first insulation layer, the second insulation layer formed of a material that has etch selectivity with respect to a material of the first insulation layer; patterning the second insulation layer to form an intermediate opening that defines a position of the opening; providing a third insulation layer on the intermediate opening, the third insulation layer formed of a material that has etch selectivity with respect to the material of the second insulation layer; and etching the first insulation layer and the third insulation layer to form the opening.

Lower sidewalls of the opening can be formed of the first and third insulation layers and upper sidewalls of the opening can be formed of the second insulation layer.

Etching the first insulation layer and the third insulation layer can be performed using one of a dry etch and etch back process.

The first insulation layer and third insulation layer can each comprise a silicon nitride material and wherein the second insulation layer comprises a silicon oxide material.

Providing a patterned insulation layer can comprises: providing a first insulation layer on the semiconductor substrate and on the gate electrode; patterning the first insulation layer to form an intermediate opening that defines a position of the opening; providing a second insulation layer on the intermediate opening, the second insulation layer formed of a material that has etch selectivity with respect to the material of the first insulation layer; and etching the second insulation layer to form the opening.

Lower sidewalls of the opening can be formed of the second insulation layer and upper sidewalls of the opening can be formed of the first insulation layer.

Etching the second insulation layer can be performed using one of a dry etch and etch back process.

The first insulation layer can comprise a silicon oxide material and the second insulation layer can comprise a silicon nitride material.

The method can further comprise: providing an array of gate electrodes in first and second directions on the semiconductor substrate; connecting neighboring gate electrodes in the first direction to provide a word line of a memory device; and connecting neighboring conductive contacts in the second direction to provide a bit line of the memory device.

The method can further comprise providing an insulative capping layer in the trench on the conductive gate electrode.

The method can further comprise providing an insulative gate electrode layer in the trench prior to providing the conductive gate electrode in the trench so that the gate electrode is isolated from the semiconductor substrate.

The method can further comprise, following forming the conductive contact in the opening: providing an enlarged opening by removing the insulation layer to expose upper portions of sidewalls of the conductive contact; and providing a conductive layer at the sidewalls and on a top of the conductive contact.

A height of the exposed upper portions of the sidewalls can be less than a height of the conductive contact.

The method can further comprise forming a conductive layer on the patterned insulation layer and on a top portion of the conductive contact.

The conductive contact can partially fill the opening and further comprising forming the conductive layer to extend into the opening to contact the conductive contact.

The conductive contact can fill the opening and further comprising forming the conductive layer on the conductive contact to contact the conductive contact.

In another aspect, a method of fabricating a memory device comprises: providing an array of memory cells in a memory cell region of a semiconductor substrate; providing a plurality of peripheral transistors in a peripheral region of the semiconductor substrate; wherein providing the array of memory cells comprises: forming first and second trenches in the memory cell region; providing first and second conductive gate electrodes in the trenches, the gate electrodes being isolated from the semiconductor substrate; providing a patterned insulation layer on the semiconductor substrate and on the first and second gate electrodes, the patterned insulation layer including first openings that expose the semiconductor substrate between the first and second gate electrode, wherein the bottom portion of the opening in the patterned insulation layer is between the first and second gate electrodes; and the patterned insulation layer including second and third openings that expose the semiconductor substrate at sides of the first and second gate electrodes respectively opposite the first conductive contact, the first, second and third openings each having a first width at a top portion thereof and having a second width at a bottom portion thereof at an interface with the semiconductor substrate, the first width being greater than the second width; and forming first, second and third conductive contacts in the first, second and third openings respectively, using selective epitaxial growth, so that a bottom portion of the first conductive contact is on the semiconductor substrate at a position that corresponds with the first opening, and so that bottom portions of the second and third conductive contacts are on the semiconductor substrate at positions that correspond with the second and third openings, the first, second and third contacts being isolated from the first and second gate electrodes, the first, second and third contacts having a first width at a top portion thereof and having a second width at a bottom portion thereof, the first width being greater than the second width, the array of memory cells extending in a first direction and in a second direction of the semiconductor substrate; forming a plurality of peripheral transistors in the peripheral region; first and second gate electrodes of neighboring memory cells in the first direction being connected in the first direction to form respective first and second word lines, the first and second word lines extending in the first direction between the memory cell region and the peripheral region; and forming a bit line on the patterned insulation layer, the bit line connected to the first contacts of neighboring memory cells in the second direction, the bit line connected to a gate of a corresponding one of the peripheral transistors in the peripheral region.

The peripheral transistor can comprise one of a trench transistor having a gate that is formed in a trench in the peripheral region of the semiconductor substrate and a conventional transistor having a gate that is formed on a surface of the peripheral region of the semiconductor substrate.

The peripheral transistor can further include source and drain regions, and further comprising: the patterned insulation layer including fourth and fifth openings that expose the semiconductor substrate at sides of the gate of the peripheral transistor, the fourth and fifth openings each having a first width at a top portion thereof and having a second width at a bottom portion thereof at an interface with the semiconductor substrate, the first width being greater than the second width; and forming fourth and fifth conductive contacts in the fourth and fifth openings respectively, using selective epitaxial growth, so that bottom portions of the fourth and fifth conductive contacts are on the semiconductor substrate at positions that correspond with the fourth and fifth openings, the fourth and fifth contacts being isolated from the gate of the peripheral transistor, the fourth and fifth contacts having a first width at a top portion thereof and having a second width at a bottom portion thereof, the first width being greater than the second width.

The method can further comprise: doping the first contacts with an impurity to form source regions in the first contacts of the memory cells; and doping the second and third contacts with an impurity to form drain regions in the second and third contacts of the memory cells.

The method can further comprise: doping the first contacts with an impurity to form drain regions in the first contacts of the memory cells; and doping the second and third contacts with an impurity to form source regions in the second and third contacts of the memory cells.

Providing a patterned insulation layer can comprise: providing a first insulation layer on the semiconductor substrate and on the gate electrodes; providing a second insulation layer on the first insulation layer, the second insulation layer formed of a material that has etch selectivity with respect to a material of the first insulation layer; patterning the second insulation layer to form intermediate openings that define positions of the openings; providing a third insulation layer on the intermediate openings, the third insulation layer formed of a material that has etch selectivity with respect to the material of the second insulation layer; and etching the first insulation layer and the third insulation layer to form the openings, Lower sidewalls of the openings can be formed of the first and third insulation layers and upper sidewalls of the openings can be formed of the second insulation layer.

Etching the first insulation layer and the third insulation layer can be performed using one of a dry etch and etch back process.

The first insulation layer and third insulation layer can each comprise a silicon nitride material and the second insulation layer can comprise a silicon oxide material.

Providing a patterned insulation layer can comprise: providing a first insulation layer on the semiconductor substrate and on the first and second gate electrodes; patterning the first insulation layer to form intermediate openings that define positions of the openings; providing a second insulation layer on the intermediate openings, the second insulation layer formed of a material that has etch selectivity with respect to the material of the first insulation layer; and etching the second insulation layer to form the openings.

Lower sidewalls of the openings can be formed of the second insulation layer and upper sidewalls of the openings can be formed of the first insulation layer.

Etching the second insulation layer can be performed using one of a dry etch and etch back process.

The first insulation layer can comprise a silicon oxide material and the second insulation layer can comprise a silicon nitride material.

The method can further comprise providing insulative capping layers in the trenches on the first and second conductive gate electrodes.

The method can further comprise providing an insulative gate electrode layer in the first and second trenches prior to providing the first and second conductive gate electrodes in the respective first and second trenches so that the first and second gate electrodes are isolated from the semiconductor substrate.

The method can further comprise, following forming the conductive contacts in the openings: providing enlarged openings by removing the insulation layer to expose upper portions of sidewalls of the conductive contacts; and providing a conductive layer at the sidewalls and on top portions of the conductive contacts.

A height of the exposed upper portions of the sidewalls can be less than a height of the conductive contacts.

The method can further comprise forming a conductive layer on the patterned insulation layer and on top portions of the first, second and third conductive contacts.

The first, second and third conductive contacts can partially fill the first, second and third openings and further comprising forming the conductive layer to extend into the first, second and third openings to contact the first, second and third conductive contacts.

The first, second and third conductive contacts can fill the first, second and third openings and further comprising forming the conductive layer on the first, second and third conductive contacts to contact the first, second and third conductive contacts.

BRIEF DESCRIPTION OF THE DRAWINGS

The foregoing and other objects, features and advantages of the embodiments of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings.

DETAILED DESCRIPTION OF EMBODIMENTS

Embodiments of the present invention will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout the specification.

It will be understood that, although the terms first, second, etc. are used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.). When an element is referred to herein as being "over" another element, it can be over or under the other element, and either directly coupled to the other element, or intervening elements may be present, or the elements may be spaced apart by a void or gap.

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

FIGS. 1A-1H are cross-sectional views of a method of forming conductive contacts for transistors in a cell region and in a peripheral region of a semiconductor memory device, in accordance with a first embodiment of the present invention.

Figure 1A:
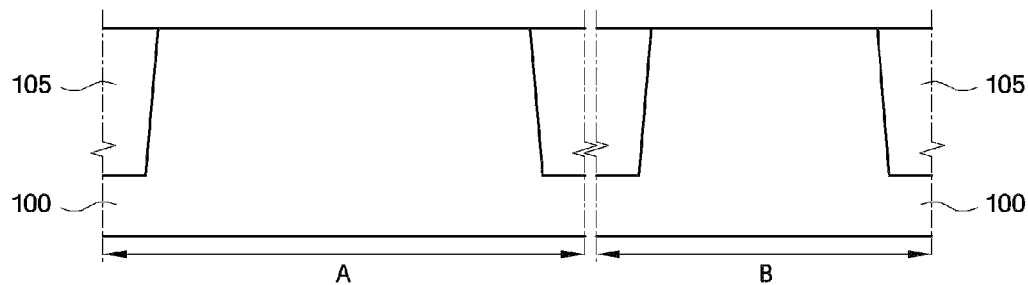
FIGS. 1A-1H are cross-sectional views of a method of forming conductive contacts for transistors in a cell region and in a peripheral region of a semiconductor memory device, in accordance with a first embodiment of the present invention.

Referring to FIG. 1A, a semiconductor substrate 100 is prepared that has a defined cell region A and a peripheral, or core, region B. Isolation trenches 105 are provided in the substrate to define active regions of the cell A and peripheral B regions. In one embodiment, the trenches 105 are prepared using conventional shallow trench isolation (STI) techniques.

Figure 1B:
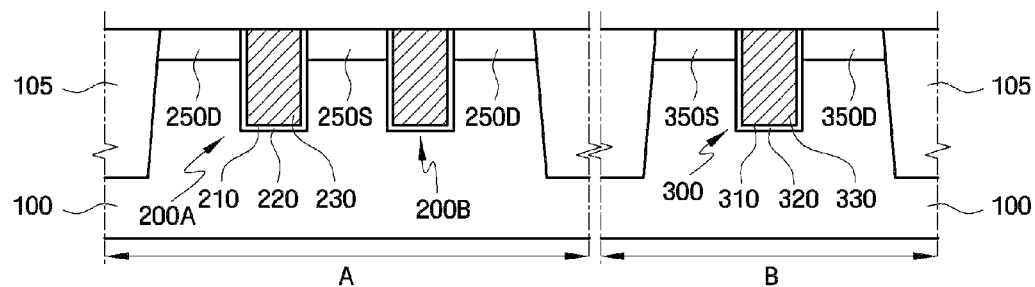

Referring to FIG. 1B, first and second gate trenches 210, 310 are respectively formed in the cell A and peripheral B regions. The gate trenches 210, 310 are each lined with a gate insulation layer 220, 320, for example comprising oxide according to conventional fabrication methods. Trench gate electrodes 230, 330 are formed in the lined gate trenches 210, 310 using a conductive material, for example using W or TiN. Source 250S, 350S and drain 250D, 350D regions are formed at sides of the resulting trench gate electrodes 230, 330 by doping the substrate with impurities. This results in the formation of first and second trench transistors 200A, 200B in the cell region A and trench transistor 300 in the peripheral region B. In the example shown, in the cell region, first (left) and second (right) paired trench gate transistors share a common source 250S. Other trench gate transistor configurations are equally applicable to the principles of the embodiments of the present specification.

While FIG. 1B illustrates formation of the source and drain regions 250S, 250D, 350S, 350D prior to the formation of the upper layers, other embodiments are possible. For example, the source and drain regions 250S, 250D, 350S, 350D can optionally be formed following formation of the SEG contact layers. In such a configuration, the source/drain regions are positioned within the SEG layer, leading to effective lengthening of the channel regions of the resulting transistors by extending the channel regions into the SEG layers. This optional embodiment will be described in further detail below.

Figure 1C:
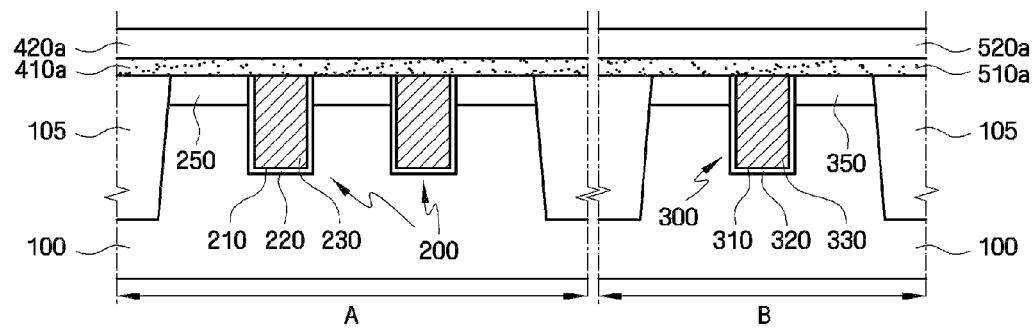

Referring to FIG. 1C, a first interlayer dielectric layer 410a, 510a is applied to the resulting structure in the cell A and peripheral B regions of the device. In one example, the first interlayer dielectric layer 410a, 510a comprises silicon nitride (SiN). A second interlayer dielectric layer 420a, 520a is then applied to the first interlayer dielectric layer 410a, 510a in the cell A and peripheral B regions of the device. In one example, the second interlayer dielectric layer 420a, 520a comprises silicon oxide ($SiO_x$). In this embodiment, the second interlayer dielectric layer 420a, 520a is preferably formed of a material that has etch selectivity with respect to the first interlayer dielectric layer 410a, 510a.

Figure 1D:
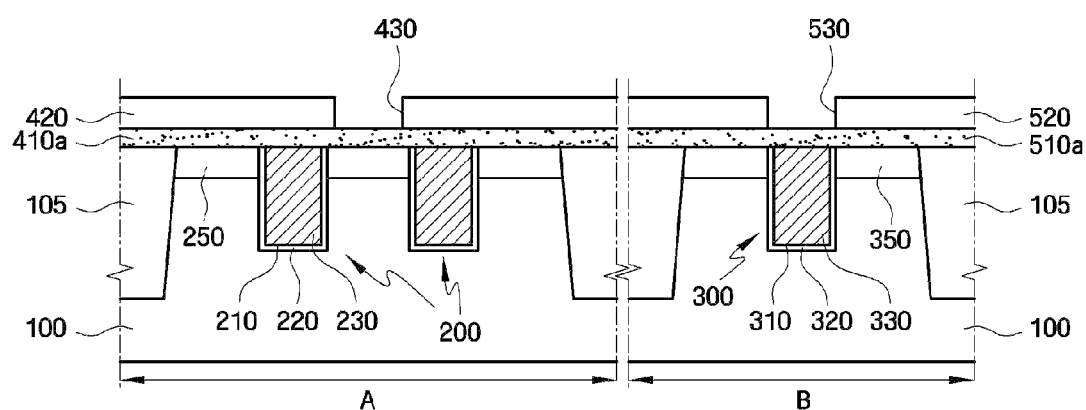

Referring to FIG. 1D, contact holes 430, 530 are formed in the second interlayer dielectric layer 420a, 520a. In the cell region A, the contact hole 430 is formed above the shared source region of the transistor pair 200, resulting in a patterned second interlayer dielectric layer 420. In the peripheral region B, the contact hole 530 is formed above the trench gate electrode 330, resulting in a patterned second interlayer dielectric layer 520.

Figure 1E:
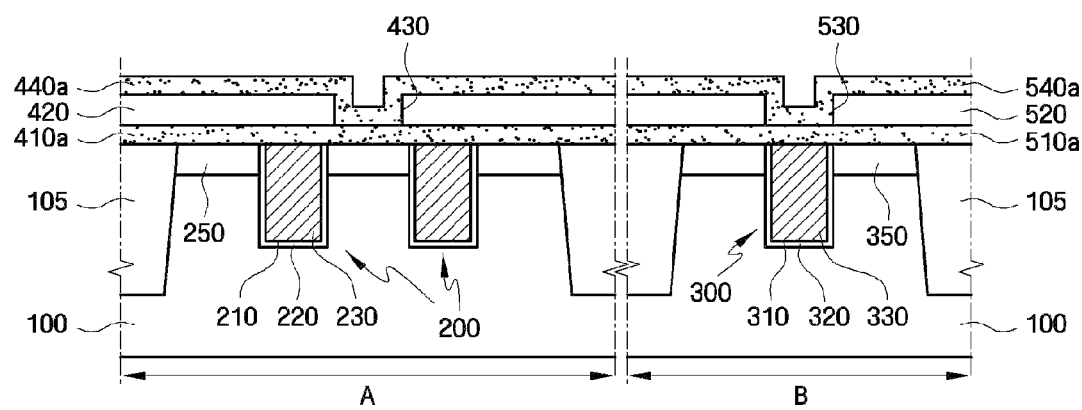

Referring to FIG. 1E, a third interlayer dielectric layer 440a, 540a is applied to the sidewalls and bottom portions of the contact holes 430, 530 and a top surface of the patterned second interlayer dielectric layer 420, 520. In one embodiment, the third interlayer dielectric layer 440a, 540a comprises a material that is the same material as that of the first interlayer dielectric layer 410a, 510a. For example, in a case where the first interlayer dielectric layer 410a, 510a comprises silicon nitride, and the second interlayer dielectric layer 420a, 520a comprises silicon oxide, the third interlayer dielectric layer 440a, 540a comprises silicon nitride. In this manner, the sidewalls and bottom surfaces of the contact holes 430, 530 are lined with a layer of third interlayer dielectric layer 440a, 540a material. In a case where the first and third dielectric layers 410a, 440a, 510a, 540a comprise silicon nitride, the thickness of the silicon nitride on a bottom surface of the contact holes 430, 530 is greater than a thickness of the silicon nitride on sidewall surfaces of the contact holes 430, 530. This difference in thickness will allow for proper formation of the desired profile of the SEG layer during subsequent processes, as will be described in further detail below.

Figure 1F:
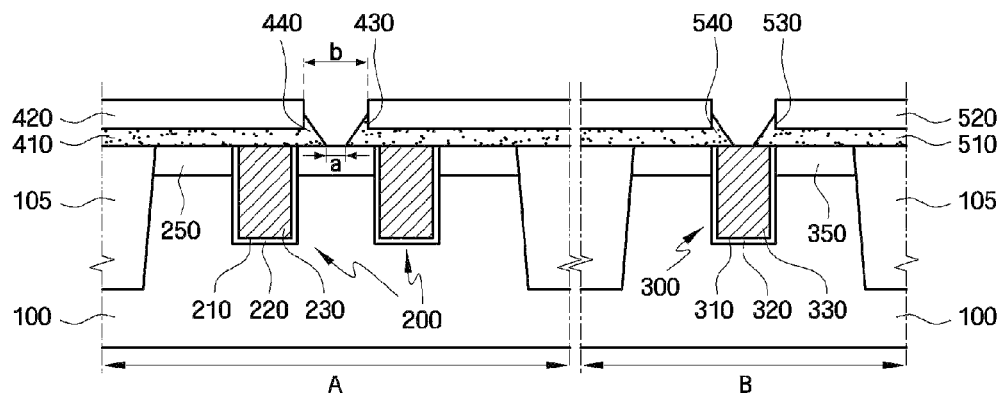

Referring to FIG. 1F, an etching process is performed on the third interlayer dielectric layer 440a, 540a and first interlayer dielectric layer 410a, 510a. In one example, a dry etch process or etch-back process is performed to provide tapered inner spacers 440, 540 on the sidewalls and bottom surfaces of the contact holes 430, 530. The height and thickness of the resulting spacers 440, 540 are determined by the etch concentration and the etch duration. The third interlayer dielectric layer 440a, 540a is substantially removed from an upper surface of the patterned second interlayer dielectric layer 420, 520 as a result of the etching process. The resulting spacers 440, 540 are shaped such that a top region of each of the contact holes 430, 530 has a width b that is greater than a width a of a bottom region of each of the contact holes 430, 530.

Figure 1G:
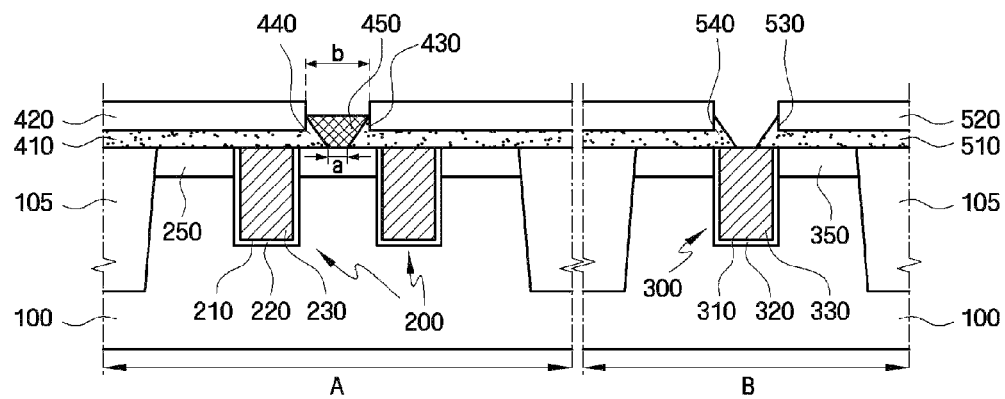

Referring to FIG. 1G, a single-crystal layer contact region 450 is formed in the contact hole 430 of the cell region on the exposed portion of the semiconductor substrate 100 between the bottom portions of the inner spacers 440. In one embodiment, the single-crystal layer contact region 450 is formed using a selective epitaxial growth (SEG) process. In an embodiment where the semiconductor substrate 100 comprises silicon, the single-crystal layer contact region 450 likewise comprises single-crystal silicon. In one embodiment, the SEG process continues until the contact hole 430 is partially filled with the single-crystal silicon so that a top portion of the single-crystal layer contact region 450 directly interfaces with the inner sidewalls of the upper portion of the contact hole 430. In this manner, the upper surface of the single-crystal layer contact region 450 has a relatively larger width for making contact with upper layers, and therefore minimizes contact resistance with upper conductive layers at the interface region thereof. The resulting single-crystal layer contact region 450 has a bottom portion of the width a that is less than the width b of its top portion as a result of the profile of the inner spacers 440.

The SEG process does not result in formation of a single-crystal layer contact region in the contact hole 530 in the peripheral region B in this example, since the contact hole 530 exposes an upper surface of the trench gate electrode 330 in this region. Crystalline growth in the SEG process will not occur on the trench gate electrode 330, since the trench gate electrode 330 is formed of tungsten.

Figure 1H:
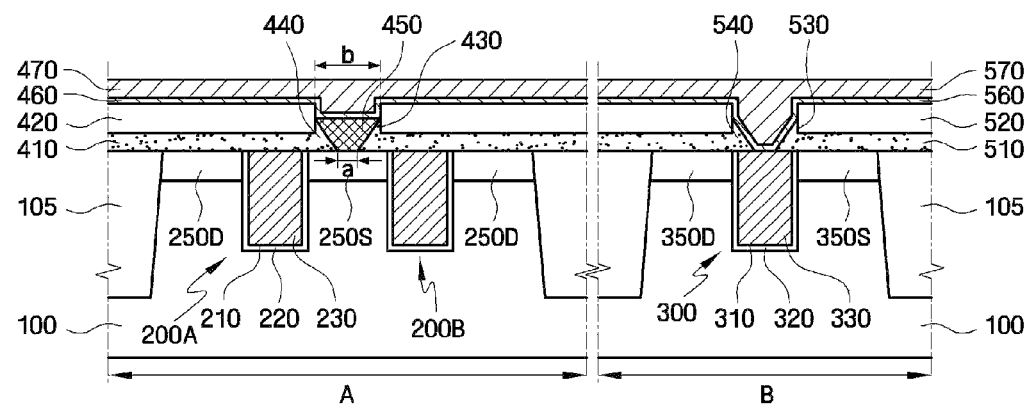

Referring to FIG. 1H, a barrier layer 460, 560 is formed over the resulting structure, on the second interlayer dielectric layer 420, 520 and in the contact holes 430, 530, in contact with the upper surface of the single-crystal layer contact region 450 in contact hole 430 in the cell region A and in contact with an upper surface of the trench gate electrode 330 in the peripheral region B. in one example, the barrier layer 460, 560 comprises titanium nitride TiN. A metal layer 470, 570 is then applied to an upper surface of the barrier layer 460, 560. The metal layer 470, 570 and barrier layer 460, 560 are patterned to provide interconnect pathways, for example, to provide a bit line of the resulting device that connects a shared source of the transistor pair 200 of the cell region A to a trench gate of a transistor 300 in the peripheral region B.

In an optional embodiment, prior to application of the barrier layer 460, 560 and metal layer 470, 570, the exposed single-crystal layer contact region 450 can be doped with impurities to form a source/drain region in the single-crystal layer contact region 450. In this example, the source/drain region may lie entirely within the single-crystal layer contact region 450, or may partially extend into the underlying substrate 100. This configuration results in an extended channel length in the resulting transistor, which can lead to further integration and higher reliability during operation.

Further, although not shown in the drawings, the height of the single-crystal layer contact region 450 can be up to the level of the top of the second patterned second interlayer dielectric layer 420, 520.

By forming the single-crystal conductive contact regions 450 using selective epitaxial growth (SEG) in this manner, the upper portion of each of the single-crystal conductive contacts is wider than the lower portion that contacts an underlying source/drain region 250S, 250D. A conductive metal plug is then formed on the resulting single/crystal conductive contact to provide a conductive via, for example, through formation of metal layer 470.

In this manner, the critical dimension of the resulting interlayer contacts is increased, and thus, the thickness of the inter-layer dielectric layer 420 through which the contacts are formed can be increased. This, in turn, increases the separation between the bit line and word line of the resulting memory device, which has a direct effect on the bit line loading capacitance of the resulting device. Reliability of the resulting device is therefore enhanced.

In addition, the single-crystal layer contact region 450 of the direct contact can be used to effectively extend the channel length of the resulting transistor, since the source/drain regions 250S, 250D can be formed therein, leading to increased device integration.

Further, a low-resistance junction is provided at the boundary of the relatively narrow bottom portion of the single-crystal layer contact region 450 and the underlying semiconductor substrate 100. Although a p-n junction is formed at the junction of the top portion of the single-crystal layer contact region 450 and the above-lying conductive barrier layer/metal layer 460, 470, the interface is relatively wider than the bottom portion of the single-crystal layer contact region 450, and therefore, resistance of the upper junction can be controlled to acceptable values.

Also, leakage current between the resulting interlayer contact and the trench gate electrode 230 is manageable, since the lower portion of the single-crystal layer contact region 450 has a reduced width, and is therefore made to be a relatively further distance from the top of the trench gate electrode 230.

Further, the presence of the inner sidewall spacers 440 provide for an increased misalignment margin, leading to greater production accuracy and efficiency. This in turn leads to greater device yield and lower production costs.

Figure 2A:
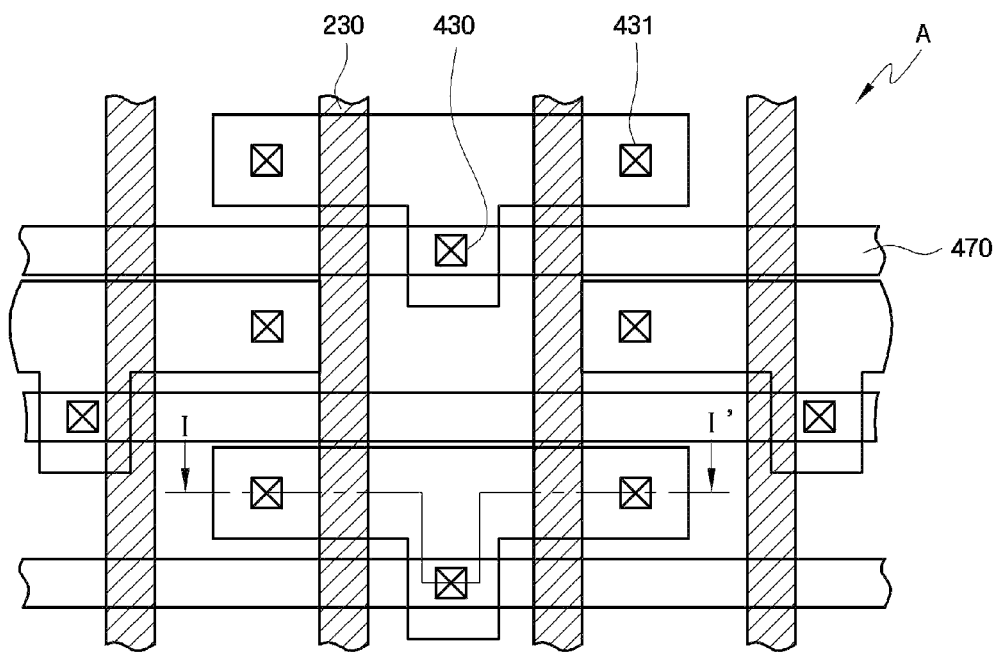
FIG. 2A is a layout view of in a cell region of a semiconductor memory device, in accordance with a first embodiment of the present invention.
Figure 2B:
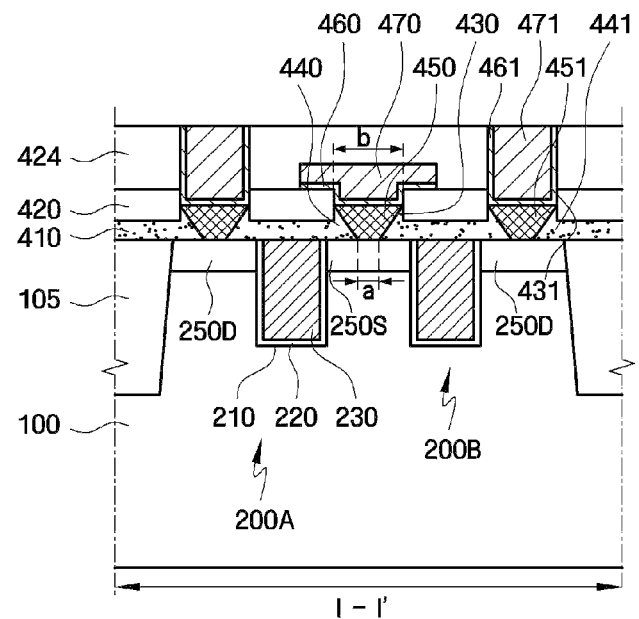
FIG. 2B is a cross-sectional view taken along the line I-I' of FIG. 2A.

FIG. 2A is a layout view of a cell region of a semiconductor memory device, in accordance with a first embodiment of the present invention. FIG. 2B is a cross-sectional view taken along the line I-I' of FIG. 2A.

Referring to FIGS. 2A and 2B, the drain regions 250D that lie at sides of the common source region 250S opposite the trench gate electrodes 230 in the cell region A can likewise be connected to corresponding upper metal interconnect features in the manner described above. The drain regions 250D can be similarly connected using single-crystal layer contact regions 451 that are fabricated in the same manner as, and at the same time as, the single-crystal layer contact region 450 used to contact the common source region 250S located between the first and second trench gates 230.

A contact hole 431 is formed on the drain regions 250D that lie at sides of the common source region 250S opposite the trench gate electrodes 230 in the cell region A. A single-crystal layer contact region 451 is formed in the contact hole 431 of the cell region on the exposed portion of the semiconductor substrate 100 between the bottom portions of the inner spacers 441. A barrier layer 461 is formed in the second interlayer dielectric layer 420 and a third interlayer dielectric layer 424 and in the contact holes 431, in contact with the upper surface of the single-crystal layer contact region 451 in contact hole 431 in the cell region A. A metal layer 471 is then applied to an upper surface of the barrier layer 461. The metal layer 471 and barrier layer 461 are patterned to provide interconnect pathways.

In addition, although not shown, the source/drain regions 350S, 350D that lie at sides of the trench gate electrodes 330 in the peripheral region B can likewise be connected to corresponding upper metal interconnect features in the manner described above. Since the contacts for the source/drain regions 350S, 350D in this example lie on a different cross-sectional plane than the trench gate electrode 330, illustration of the fabrication thereof and the resulting device are not provided herein. The source/drain regions 350S, 350D of the peripheral transistors 300 can be similarly connected using single-crystal layer contact regions that are fabricated in the same manner as the single-crystal layer contact region 450 used to contact the common source region 250S located between the first and second trench gates 230 of the cell region A.

Figure 3:
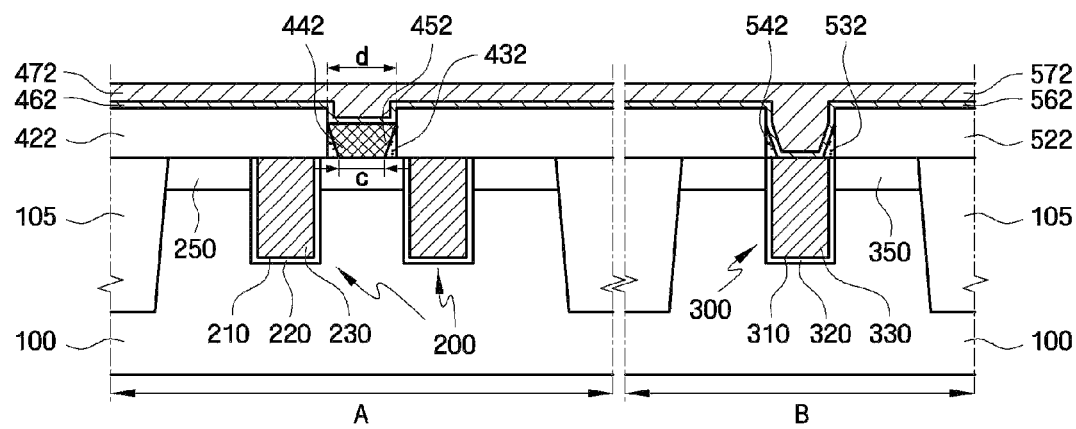
FIG. 3 is a cross-sectional view of a conductive contact for transistors in a cell region and in a peripheral region of a semiconductor memory device, in accordance with a second embodiment of the present invention.

FIG. 3 is a cross-sectional view of a conductive contact for transistors in a cell region and in a peripheral region of a semiconductor memory device, in accordance with a second embodiment of the present invention. Fabrication of this second embodiment is similar to that of the first embodiment, with the exception that the interlayer dielectric layer 422 of the second embodiment is formed as a single layer on the semiconductor substrate 100, rather than in two layers 410, 420 as shown above. An advantage of this embodiment is that the fabrication is simplified in that the step of forming the first interlayer dielectric layer 410 of the first embodiment is not required. However, in the present second embodiment, the amount of control in the resulting dimension of the thickness of the resulting tapered inner spacers 442 formed in the contact hole 432 is reduced. Also, since only a single layer of insulative interlayer material is used to form the spacers, it has a thickness that is nearly the same on the sidewalls and bottom of the contact hole 432, therefore, the degree of taper in the resulting inner spacers is reduced. As a result, the difference between the width d at a top portion of the resulting single-crystal layer contact region 452 and the width c at a bottom portion of the resulting single-crystal layer contact region 452 is not as large as in the first embodiment.

Figure 4:
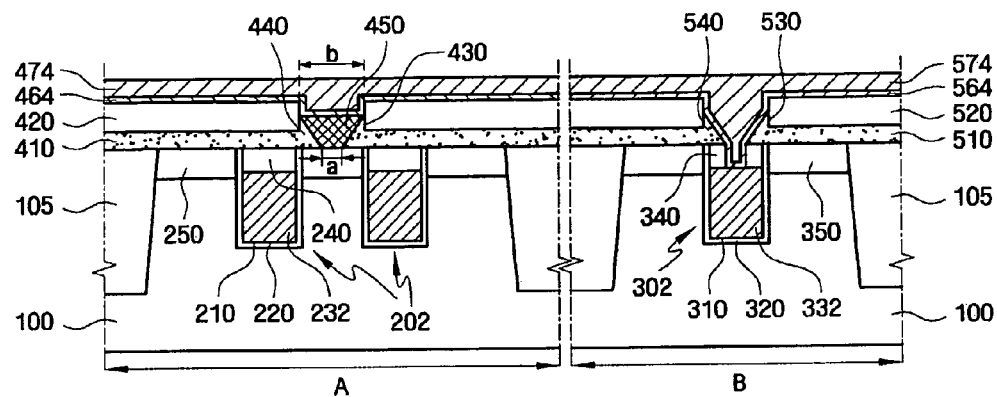
FIG. 4 is a cross-sectional view of a conductive contact for transistors in a cell region and in a peripheral region of a semiconductor memory device, in accordance with a third embodiment of the present invention.

FIG. 4 is a cross-sectional view of a conductive contact for transistors in a cell region and in a peripheral region of a semiconductor memory device, in accordance with a third embodiment of the present invention. Fabrication of this third embodiment is similar to that of the first embodiment, with the exception being that the trench gate electrodes 232, 332 are recessed within the gate trenches 210, 310, and an insulative capping layer 240, 340 is applied to the top of the trench gate electrodes 232, 332. Such a configuration allows for greater misalignment of the single-crystal layer contact region 450 relative to the gate electrodes 232, and further avoids shorting between the single-crystal layer contact region 450 and the gate electrodes 232. In this embodiment, the contact openings are formed so that the resulting barrier layer 464, 564 and metal layer 474, 574 penetrate the capping layer 240, 340 so as to make contact with the underlying trench gate electrodes 332.

Figure 5:
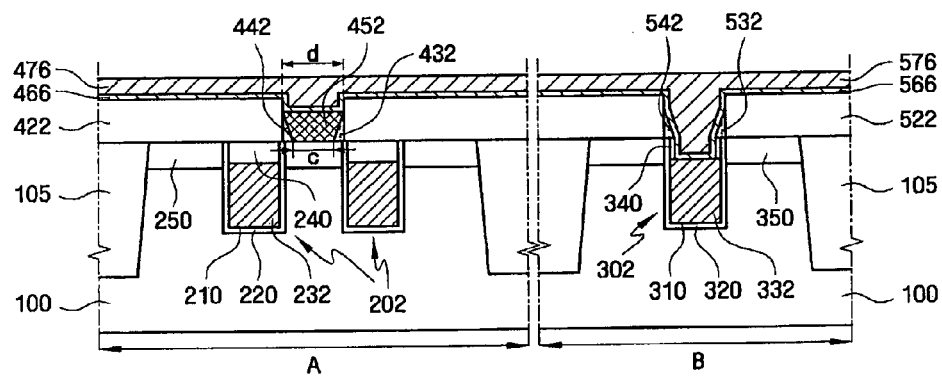
FIG. 5 is a cross-sectional view of a conductive contact for transistors in a cell region and in a peripheral region of a semiconductor memory device, in accordance with a fourth embodiment of the present invention.

FIG. 5 is a cross-sectional view of a conductive contact for transistors in a cell region and in a peripheral region of a semiconductor memory device, in accordance with a fourth embodiment of the present invention. Fabrication of this fourth embodiment is similar to that of the third embodiment, as applied to the second embodiment. As in the third embodiment, insulative capping layers 240, 340 are applied to top portions of the trench gate electrodes 232, 332, and the contact openings are formed so that the resulting barrier layer 466, 566 and metal layer 476, 576 penetrate the capping layer 240, 340 so as to make contact with the underlying trench gate electrodes 332.

Figure 6A:
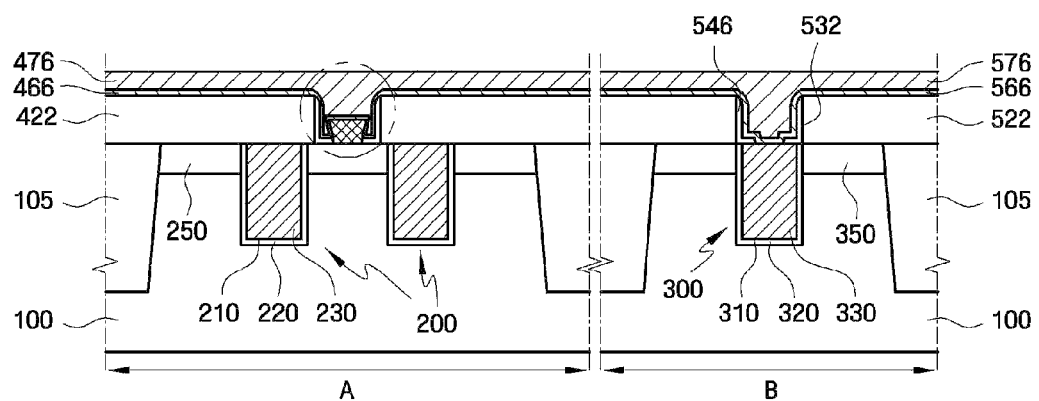
FIG. 6A is a cross-sectional view.
Figure 6B:
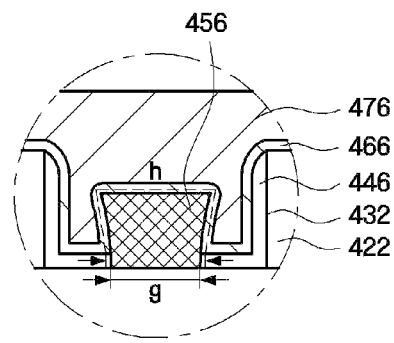
FIG. 6B is a close-up cross-sectional view of a conductive contact for transistors in a cell region and in a peripheral region of a semiconductor memory device, in accordance with a fifth embodiment of the present invention.

FIG. 6A is a cross-sectional view, and FIG. 6B is a close-up cross-sectional view of a conductive contact for transistors in a cell region and in a peripheral region of a semiconductor memory device, in accordance with a fifth embodiment of the present invention. Fabrication of this fifth embodiment is similar to that of the second embodiment, with the exception of the formation of the single-crystal layer contact region 456. An advantage of this embodiment is a top portion of the resulting single-crystal layer contact region 456 is surrounded by the metal layer 476, and therefore the contact area is increased. This, in turn, leads to decreased contact resistance at this interface.

Figure 7:
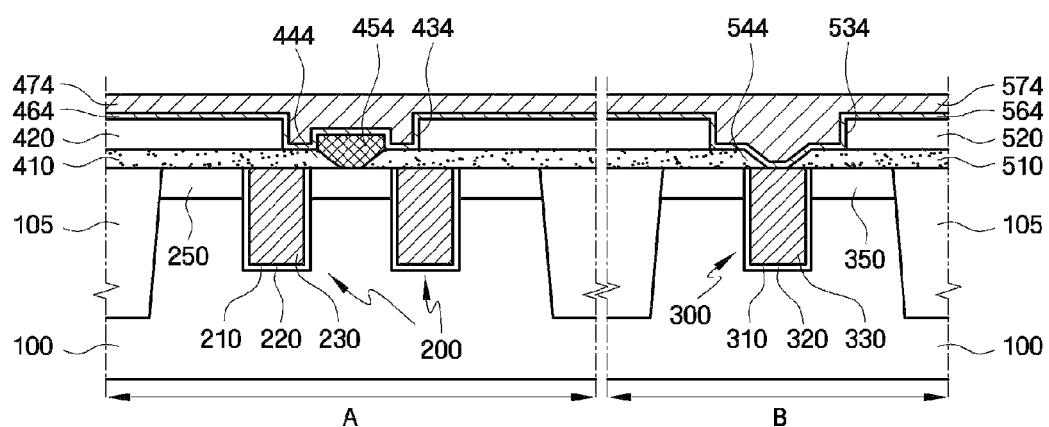
FIG. 7 is a cross-sectional view of a conductive contact for transistors in a cell region and in a peripheral region of a semiconductor memory device, in accordance with a sixth embodiment of the present invention.

FIG. 7 is a cross-sectional view of a conductive contact for transistors in a cell region and in a peripheral region of a semiconductor memory device, in accordance with a sixth embodiment of the present invention. Fabrication of this sixth embodiment is similar to that of the first embodiment, with the exception that a top portion of the single-crystal layer contact region 454 is surrounded by the metal layer 474, leading to decreased contact resistance at this interface. In this embodiment, the contact hole 434 can be made to extend over the trench gate electrodes 230, 330. This increases the misalignment margin during fabrication and increases the contact area between the single-crystal layer contact region 454 and the metal layer 474, thereby reducing resistance at that junction.

Figure 8:
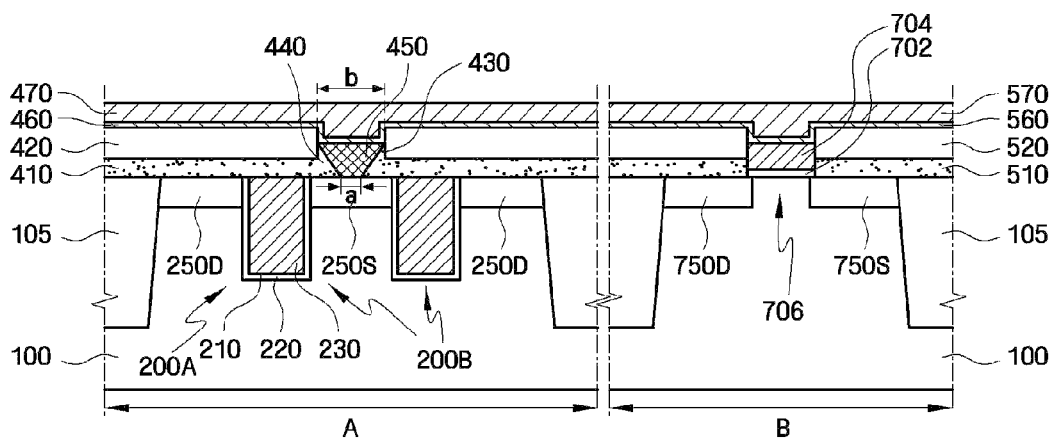
FIG. 8 is a cross-sectional view of a conductive contact for transistors in a cell region and in a peripheral region of a semiconductor memory device, in accordance with a seventh embodiment of the present invention.

FIG. 8 is a cross-sectional view of a conductive contact for transistors in a cell region and in a peripheral region of a semiconductor memory device, in accordance with a seventh embodiment of the present invention. In the seventh embodiment, the transistors in the cell region comprise trench transistors having direct contacts that are formed according to the embodiments described above, while the transistor in the peripheral region B comprises a conventional transistor 706, including a source region 750S, a drain region 750D, a gate oxide layer 702, and a gate electrode 704, the gate electrode 704 being connected to the metal layer 510 through the barrier layer 560.

While the invention has been particularly shown and described with references to preferred embodiments thereof, it will be understood by those skilled in the art that various changes in form and details may be made herein without departing from the spirit and scope of the invention as defined by the appended claims.

What is claimed is:

1. A memory cell of a memory device, comprising:
    an active region of a memory cell defined in a semiconductor substrate;
    a conductive gate electrode in a trench of the active region, the conductive gate electrode being isolated from the semiconductor substrate and having a top surface coplanar with a top surface of the active region;
    an insulation layer on the active region and on the top surface of the conductive gate electrode; and
    a conductive contact in the insulation layer on the active region at a side of the gate electrode and isolated from the gate electrode, the contact having a first width at a top portion thereof and having a second width at a bottom portion thereof, the first width being greater than the second width, the contact being formed of a single-crystal material;
    wherein the insulation layer comprises:
        a first insulation layer on the semiconductor substrate and on the gate electrode;
        a second insulation layer on the first insulation layer, the second insulation layer comprising a material that has etch selectivity with respect to a material of the first insulation layer; and
        a third insulation layer in the second insulation layer and on the first insulation layer, the third insulation layer comprising a material that has etch selectivity with respect to the material of the second insulation layer, the third insulation layer lining at least a lower portion of an opening formed in the second insulation layer through which the contact is disposed, the first insulation layer and the third insulation layer surrounding, and in direct contact with, a lower portion of the contact, the contact provided through the first, second, and third insulation layers.

2. The memory cell of claim 1 wherein the single-crystal material of the contact is formed using a selective epitaxial growth process.

3. The memory cell of claim 1 wherein the trench comprises first and second trenches in the active region that are spaced apart from each other, and wherein the conductive gate electrode comprises first and second conductive gate electrodes respectively in the first and second trenches, and wherein the bottom portion of the conductive contact is on the semiconductor substrate at a position between the first and second gate electrodes and is isolated from the first and second gate electrodes.

4. The memory cell of claim 3 wherein the conductive contact comprises a first conductive contact, and wherein the memory cell further comprises second and third conductive contacts at sides of the first and second gate electrodes, respectively, opposite the first conductive contact, the second and third conductive contacts being formed of the single-crystal material, the second and third contacts each having a first width at a top portion thereof and having a second width at a bottom portion thereof, the first width being greater than the second width, and the second and third contacts each being isolated from the first and second gate electrodes respectively.

5. The memory cell of claim 4:
    wherein the first contact is doped with an impurity to provide a source region of the memory cell in the first contact; and
    wherein the second and third contacts are doped with an impurity to provide drain regions of the memory cell in the second and third contacts.

6. The memory cell of claim 4:
    wherein the first contact is doped with an impurity to provide a drain region of the memory cell in the first contact; and
    wherein the second and third contacts are doped with an impurity to provide source regions of the memory cell in the second and third contacts.

7. The memory cell of claim 1 wherein the contact is doped with an impurity to provide a source or drain region in the contact.

8. The memory cell of claim 1 wherein upper sidewalls of the contact are in direct contact with the third insulation layer.

9. The memory cell of claim 1 wherein the first insulation layer and third insulation layer each comprise a silicon nitride material and wherein the second insulation layer comprises a silicon oxide material.

10. The memory cell of claim 1 further comprising:
    an array of gate electrodes in first and second directions on the semiconductor substrate;
    neighboring gate electrodes in the first direction being connected to provide a word line of a memory device; and
    neighboring conductive contacts in the second direction being connected to provide a bit line of the memory device.

* * * * *